US012575084B2

(12) United States Patent (10) Patent No.: US 12,575,084 B2
Lu et al. (45) Date of Patent: Mar. 10, 2026

(54) MEMORY STRUCTURE HAVING A BURIED WORD LINE

(71) Applicant: Invention And Collaboration Laboratory Pte. Ltd., Singapore (SG)

(72) Inventors: Chao-Chun Lu, Taipei City (TW); Ming-Hong Kuo, Hsinchu (TW); Chun-Nan Lu, Hsinchu (TW)

(73) Assignees: Invention And Collaboration Laboratory Pte. Ltd., Singapore (SG); Etron Technology, Inc., Hsinchu (TW)

( * ) Notice: Subject to any disclaimer, the term of this patent is extended or adjusted under 35 U.S.C. 154(b) by 351 days.

(21) Appl. No.: 18/220,845

(22) Filed: Jul. 12, 2023

(65) Prior Publication Data

US 2024/0023314 A1     Jan. 18, 2024

Related U.S. Application Data

(60) Provisional application No. 63/393,317, filed on Jul. 29, 2022, provisional application No. 63/388,261, filed on Jul. 12, 2022.

(51) Int. Cl.
H10B 12/00          (2023.01)

(52) U.S. Cl.
CPC ........... H10B 12/34 (2023.02); H10B 12/053 (2023.02); H10B 12/482 (2023.02); H10B 12/488 (2023.02)

(58) Field of Classification Search
CPC .... H10B 12/033; H10B 12/053; H10B 12/31; H10B 12/34; H10B 12/482; H10B 12/488
See application file for complete search history.

(56) References Cited

U.S. PATENT DOCUMENTS

| | | |
|---|---|---|
| 2003/0203508 A1 | 10/2003 | Yates |
| 2005/0253179 A1 | 11/2005 | Park |
| 2006/0186452 A1 | 8/2006 | Nam |
| 2010/0140676 A1 | 6/2010 | Yeom |
| 2014/0210087 A1 | 7/2014 | Kang |
| 2015/0060970 A1 | 3/2015 | Sasaki |
| 2015/0255464 A1 | 9/2015 | Lee |
| 2019/0363093 A1* | 11/2019 | Chen ................... H01L 21/0228 |
| 2020/0168611 A1 | 5/2020 | Jeon |
| 2021/0201960 A1 | 7/2021 | Lu |
| 2022/0122990 A1 | 4/2022 | Liu |

FOREIGN PATENT DOCUMENTS

| | | |
|---|---|---|
| CN | 114334978 A | 4/2022 |
| KR | 10-2004-0077736 A | 9/2004 |
| KR | 10-2005-0103635 A | 11/2005 |
| KR | 10-2006-0087315 A | 8/2006 |

(Continued)

*Primary Examiner* — Hoai V Pham
(74) *Attorney, Agent, or Firm* — Winston Hsu

(57) ABSTRACT
A memory structure includes a semiconductor substrate, an active region, a transistor, and a buried-WL (word line). The semiconductor substrate has an original semiconductor surface. The active region is in the semiconductor substrate and surrounded by a shallow trench isolation (STI) region. The transistor is formed based on the active region. The buried-WL (word line) extends through the active region and the STI region. The buried-WL has variable depth or width along the extension direction of the buried-WL.

18 Claims, 14 Drawing Sheets

(56) References Cited

FOREIGN PATENT DOCUMENTS

| | | | |
|---|---|---|---|
| KR | 10-2010-0065860 | A | 6/2010 |
| KR | 10-2014-0096874 | A | 8/2014 |
| KR | 10-2015-0104362 | A | 9/2015 |
| KR | 10-2020-0061871 | A | 6/2020 |
| KR | 10-2021-0086968 | A | 7/2021 |
| TW | 202013520 | A | 4/2020 |

* cited by examiner

AQ2   AQ1   AQ3                6302

6702

6102

1602

2402

2102
Source-3

Hole-1/2  Hole-1/3
Source-1

UGBL(a sketch to illustrate a UGBL
behind the scene of this cross-section
view along the X-direction cutline)

STI

202

(a)

Drain-2 Drain-1 Source-1 Source-3        1402 1602

UGBL

Gate
of
AQ1

UGBL

UGBL

WL1   3302   WL2        WL3

(b)

210  402  210  210  206  210

204

502

504 { 5042
      5044

STI

202

(a)

402  206        Cutline along the Y direction

5042

604

5044

502

(b)

(a)

(b)

MEMORY STRUCTURE HAVING A BURIED WORD LINE

CROSS REFERENCE TO RELATED APPLICATIONS

This application claims the benefit of U.S. Provisional Application No. 63/393,317, filed on Jul. 29, 2022. Further, this application claims the benefit of U.S. Provisional Application No. 63/388,261, filed on Jul. 12, 2022. The contents of these applications are incorporated herein by reference.

BACKGROUND OF THE INVENTION

1. Field of the Invention

The present invention relates to a memory structure, and particularly to a memory structure which not only gets lower WL (word line) to BL (bit line) coupling capacitance but also gets lower WL resistance that dependent on the buried-WL pattern etching process.

2. Description of the Prior Art

Each DRAM (dynamic random access memory) cell includes an access transistor and a storage capacitor, a gate of the access transistor is coupled to a word line (WL) and a sense amplifier is coupled to the access transistor through the bit line (BL). The DRAM cell uses the access transistor as a switch to control the charges to be stored from the bit line (BL) into the capacitor in WRITE mode or to be transferred out to bit line in READ mode. However, a plurality DRAM cells (such as 256, 512, or 1024 cells) are connected to one bit line BL, thus, the bit line BL has heavy load. During the charge sharing between the bit line and one capacitor of the DRAM cell, due to the voltage difference between the storage capacitor of the DRAM cell and its corresponding bit line voltage, the cell charge is shared with the bit line. This process makes the bit line voltage either lower or higher than the equalization voltage Veq at which the bit line originally stays, wherein forming a voltage difference Vsign in the bit line according to equation (1):

$$Vsign = \frac{Cs}{Cs + Cbl}(Vcell - Veq) \qquad (1)$$

In equation (1), Vcell is an initial cell voltage, Cs is capacitance of the cell capacitor, Cbl is bit line parasitic capacitance. Vcell ideally exhibits two levels, that is, VCCSA (or Vcc) for signal One and 0 for signal Zero.

Furthermore, the heavy load of the bit line will be modeled as a parasitic RC network. Thus, a large voltage propagation delay will appear, and this delay effect is more especially severe for those DRAM cell nodes located at the far-end of the bit line. Therefore, the speed of voltage sensing will be greatly limited by the bit line parasitic resistance Rbl and parasitic capacitance Cbl. Thus, how to reduce the parasitic capacitance Cbl of the bit line will be a key factor to improve the performance of the DRAM structure. Table 1 shows a typical example of the capacitances related the bit line capacitance. As shown in Table 1, the bit line to Word line coupling capacitance is one key factor in the bit line capacitance Cbl, thus, lower bit line to word line coupling capacitance could improve the bit line capacitance Cbl.

TABLE 1

| Components | $\times 10^{-3}$ fF |
|---|---|
| bit line to bit line | ~2 |
| bit line to S-SN (self storage node) | ~13 |
| bit line to O-SN (other storage nodes) | ~12 |
| bit line to word line | ~12 |
| bit line to substrate | ~1 |
| Total | 40 |

Similarly, a Cwordline per DRAM cell (or a capacitance of the word line per DRAM cell (Cwl)) for the semiconductor memory structure is also critical for the DRAM operation speed. Furthermore, if the RC time constant of the word line is reduced, one local word line could be connected to more access transistors (from 1000 to 2000~3000) and therefore the number of the local word line driver could be reduced as well. That is, two sub-arrays with two local word lines (LWL) could be merged into a new sub-array in which the new LWL length of the new sub-array is 2 times of the original LWL length.

SUMMARY OF THE INVENTION

An embodiment of the present invention provides a memory structure. The memory structure includes a semiconductor substrate, an active region, a transistor, and a buried-WL (word line). The semiconductor substrate has an original semiconductor surface. The active region is in the semiconductor substrate and surrounded by a shallow trench isolation (STI) region. The transistor is formed based on the active region. The buried-WL (word line) extends through the active region and the STI region. The buried-WL has variable depth or width along the extension direction of the buried-WL.

According to one aspect of the invention, a depth of the buried-WL above the active region is different from a depth of the buried-WL above the STI region.

According to one aspect of the invention, the depth of the buried-WL above the active region is less than the depth of the buried-WL above the STI region.

According to one aspect of the invention, the depth of the buried-WL above the active region is greater than the depth of the buried-WL above the STI region.

According to one aspect of the invention, a width of the buried-WL above the active region is different from a width of the buried-WL above the STI region.

According to one aspect of the invention, the width of the buried-WL above the active region is less than the width of the buried-WL above the STI region.

According to one aspect of the invention, the width of the buried-WL above the active region is greater than the width of the buried-WL above the STI region.

According to one aspect of the invention, the transistor includes a gate structure, a first conductive region, and a second conductive region, and the memory structure further includes a capacitor, wherein the capacitor has a signal electrode and a counter electrode, the capacitor is over the transistor, and the signal electrode is electrically coupled to the second conductive region of the transistor and isolated from the first conductive region of the transistor.

According to one aspect of the invention, the signal electrode has an H-shape structure covering a top surface and two sidewalls of the gate structure.

According to one aspect of the invention, the memory structure further includes a bit line and a connecting plug.

The bit line is disposed under the original semiconductor surface. The connect plug electrically connects the bit line to the first conductive region of the transistor.

According to one aspect of the invention, the bit line is disposed within the STI region, and the STI region includes a set of asymmetric material spacers.

According to one aspect of the invention, the signal electrode includes two upward extending pillars and a plurality of lateral beams connected the two upward extending pillars.

According to one aspect of the invention, the transistor includes a gate structure, a first conductive region, and a second conductive region, wherein the gate structure includes a gate conductive region and a cap dielectric region above the gate conductive region, and a top surface of the gate conductive region is lower than the original semiconductor surface.

Another embodiment of the present invention provides a memory structure. The memory structure includes a semiconductor substrate, an active region, a transistor, and a buried-WL (word line). The semiconductor substrate has an original semiconductor surface. The active region is in the semiconductor substrate and surrounded by a shallow trench isolation (STI) region. The transistor is formed based on the active region, and the transistor includes a gate structure which includes a gate conductive region and a cap dielectric region. The buried-WL is connected to the gate structure of the transistor. A width of the gate conductive region is different from a width of the buried-WL in the STI region, or a depth of the gate conductive region is different from a depth of the buried-WL in the STI region.

According to one aspect of the invention, the width of the gate conductive region is less than the depth of the buried-WL above the STI region.

According to one aspect of the invention, the depth of the gate conductive region is greater than the depth of the buried-WL above the STI region.

According to one aspect of the invention, the width of the gate conductive region is less than the width of the buried-WL above the STI region.

According to one aspect of the invention, the width of the gate conductive region is greater than the width of the buried-WL above the STI region.

These and other objectives of the present invention will no doubt become obvious to those of ordinary skill in the art after reading the following detailed description of the preferred embodiment that is illustrated in the various figures and drawings.

DETAILED DESCRIPTION

Anew dynamic random access memory (DRAM) cell structure with underground bit line (UGBL) and H-shape capacitor over the access transistor (HCoT) was disclosed in U.S. patent application Ser. No. 17/337,391, filed on Jun. 2, 2021 and entitled "MEMORY CELL STRUCTURE", the contents of which are incorporated herein by reference.

Based on the aforesaid DRAM cell structure with underground bit line (UGBL) and H-shape capacitor over the access transistor (HCoT), one can adjust the etching process regarding the formation of the buried word line to get different depth of word line between AA (active area) and shallow trench isolation (STI) for achieving lower coupling capacitance between WL (word line) and BL (bit Line) or get lower WL resistance. Below are the details to describe the structure and process examples.

Figure 1:
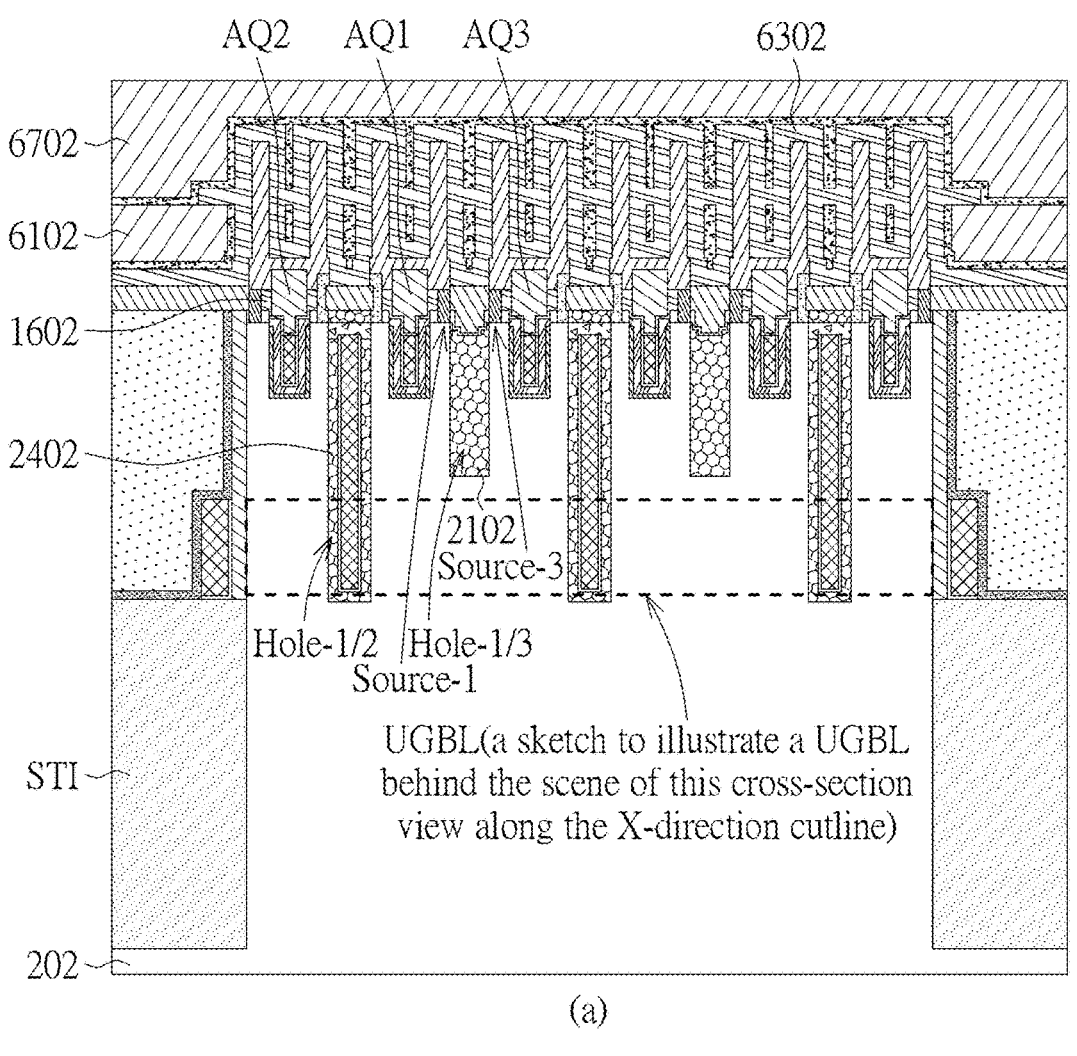
FIG. 1 shows the dynamic random access memory (DRAM) cell structure with underground bit line (UGBL) and H-shape capacitor over the access transistor (HCoT) according to the prior art.
Figure 1:
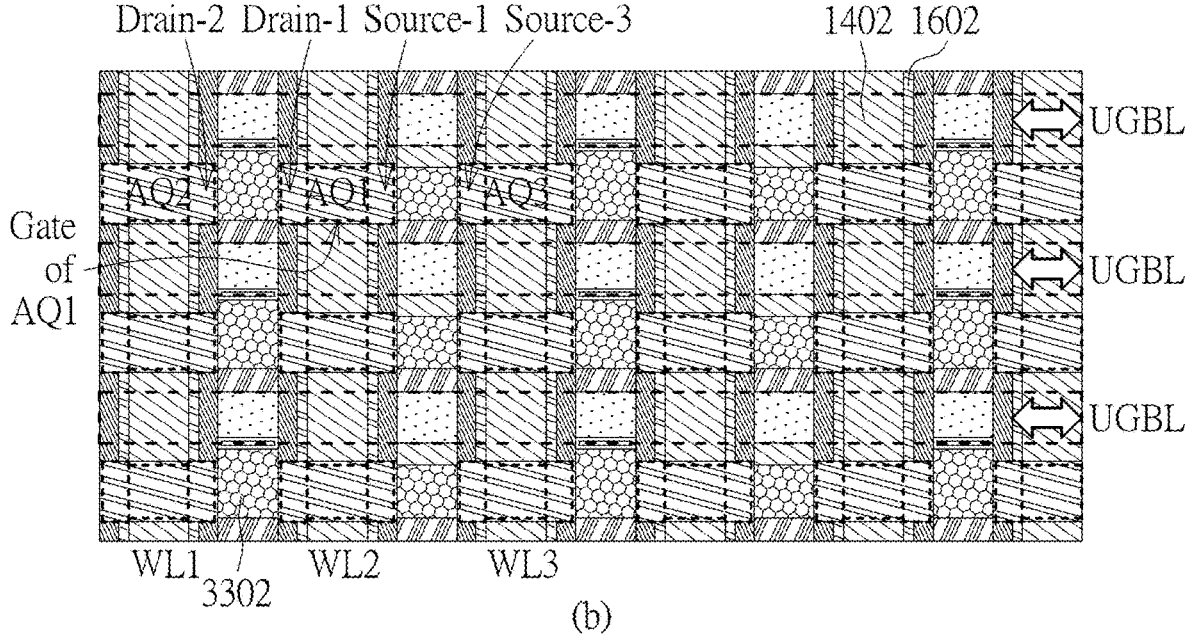

FIG. 1(*a*) shows the aforesaid DRAM cell structure with underground bit line (UGBL) and H-shape capacitor over the access transistor (HCoT), especially the cross section view in x-direction, and FIG. 1(*b*) is a corresponding top view. Here, the present invention focuses on buried-WL as marked by "AQ1", "AQ2", "AQ3" and the others the same in FIG. 1(*a*).

Figure 2:
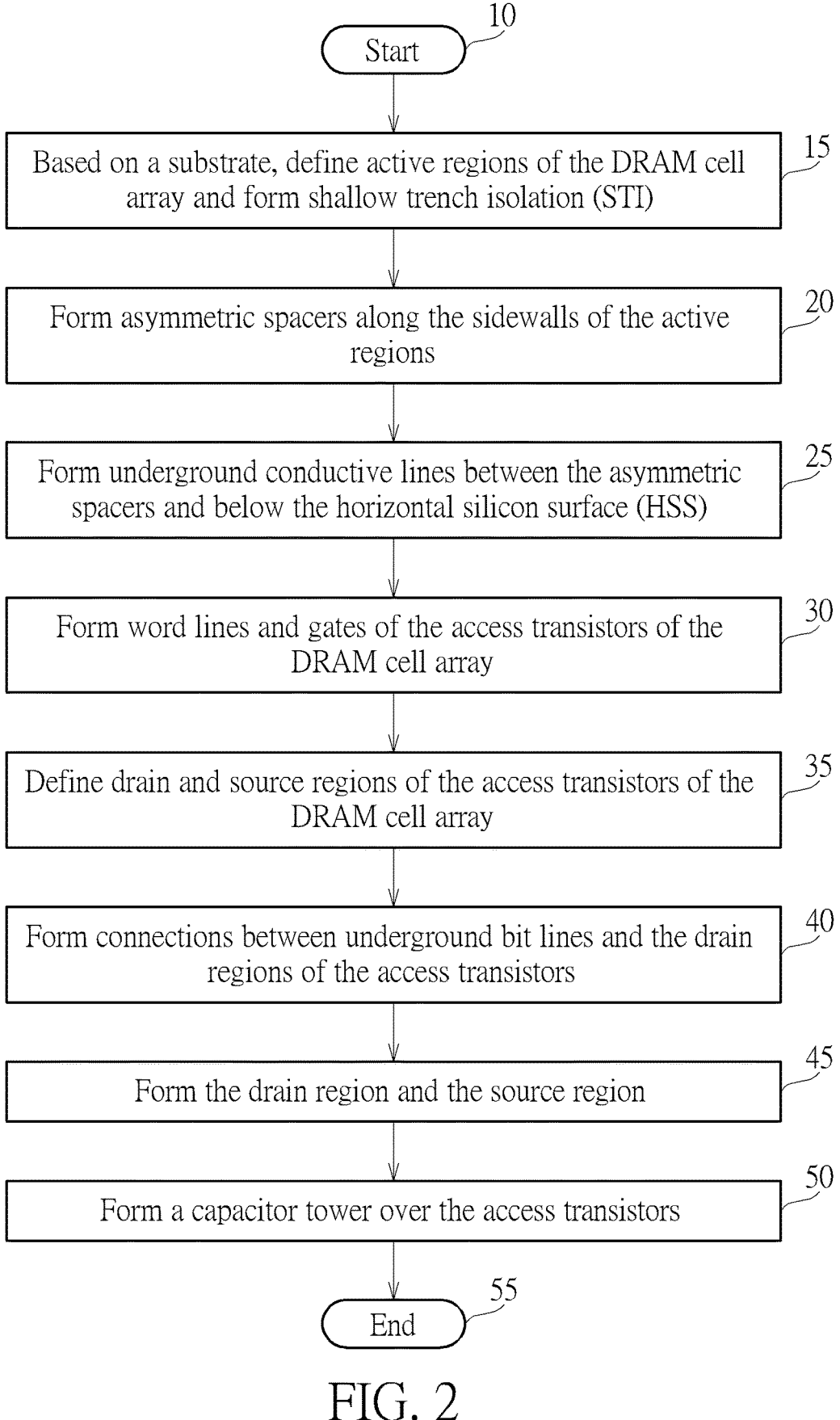
FIG. 2 is a flowchart illustrating a manufacturing method of a UGBL DRAM cell structure with different WL depth in STI and AA according to an embodiment of the present invention.

Please refer to FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, wherein FIG. 2 is a flowchart illustrating a manufacturing method of a UGBL DRAM cell structure with different WL depth in STI and AA according to an embodiment of the present invention.

Step 10: Start.

Step 15: based on a substrate (such as, a p-type silicon substrate), define active regions of the DRAM cell array and form shallow trench isolation (STI).

Step 20: Form asymmetric spacers along the sidewalls of the active regions.

Step 25: Form underground conductive lines (such as bit lines) between the asymmetric spacers and below the horizontal silicon surface (HSS).

Step 30: Form word lines and gates of the access transistors of the DRAM cell array.

Step 35: Define drain (i.e. first conductive regions) and source regions (i.e. second conductive regions) of the access transistors of the DRAM cell array.

Step 40: Form connections between underground bit lines and the drain regions of the access transistors.

Step 45: Form the drain region and the source region.

Step 50: Form a capacitor tower over the access transistors.

Step 55: End.

Because the contents of the U.S. patent application Ser. No. 17/337,391 are incorporated herein by reference and the present invention focuses on the buried-WL, Steps 15, 20, 35, 40, 45, 50 can be referred to the U.S. patent application Ser. No. 17/337,391, that is, further description thereof is omitted for simplicity.

Figure 3:
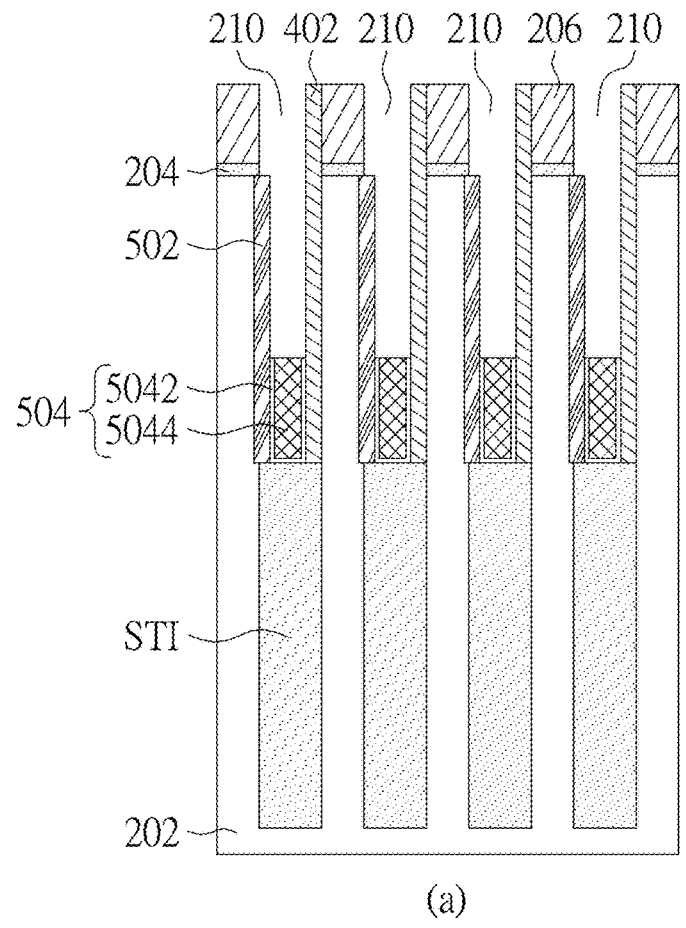
FIG. 3 and FIG. 4 show the UGBL process first then following buried-WL patterning.
Figure 3:
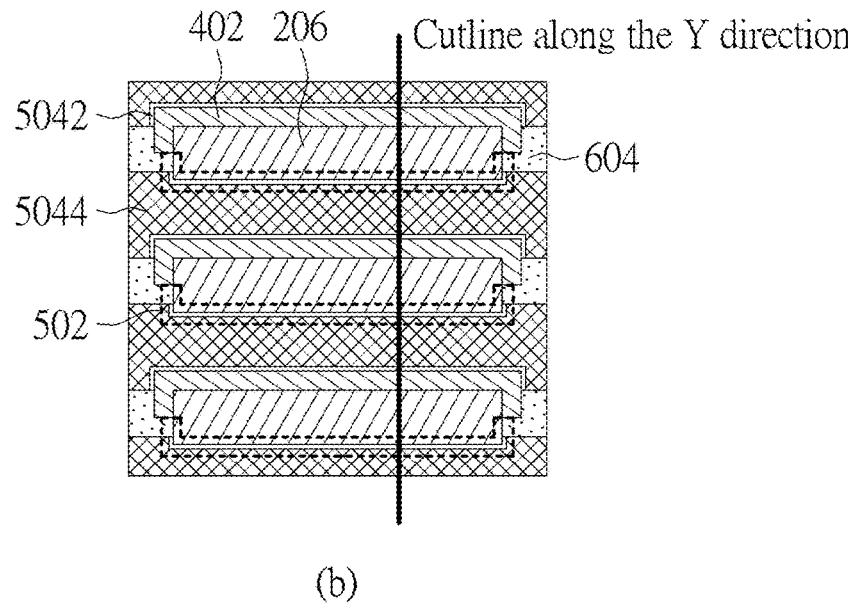
Figure 4:
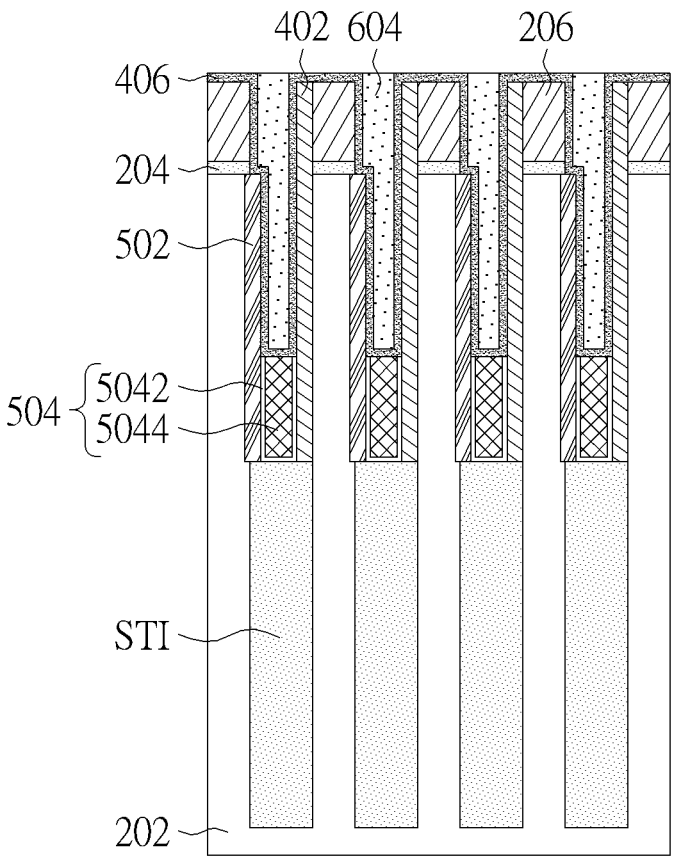

FIG. 3 and FIG. 4 simply describe the UGBL process first then following buried-WL patterning.

In Step 25, FIG. 3(*a*) shows the UGBL DRAM cell structure cross section in y-direction that patterning AA (active area) and ISO (isolation area, or STI region) through the pad-nitride layer 206 and the pad-oxide layer 204, then do STI oxide etching back, and form asymmetric spacers with sidewall spacer (i.e. a nitride-1 (e.g. SiOCN) spacer

402 and an oxide-1 spacer 502). Then, the UGBL 504 (e.g. composed of TiN layer 5042 and W layer 5044) deposition and etching back are followed, wherein for example, the UGBL 504 has a thickness about 40 nm. In addition, FIG. 3(*b*) is a top view corresponding to FIG. 3(*a*), and FIG. 3(*a*) is a cross-section view along a cut line of a Y direction shown in FIG. 3(*b*).

FIG. 4 shows to form a cap nitride layer 406 to protect a top of the UGBL 504 to prevent metal oxidation issue then deposit HDP (high-density-plasma) Oxide 604 to fill the trench 210 and do planarization by chemical mechanical polishing (CMP) technique. Thus, the UGBL 504 is formed within the STI region which is next to the active region.

Figure 5:
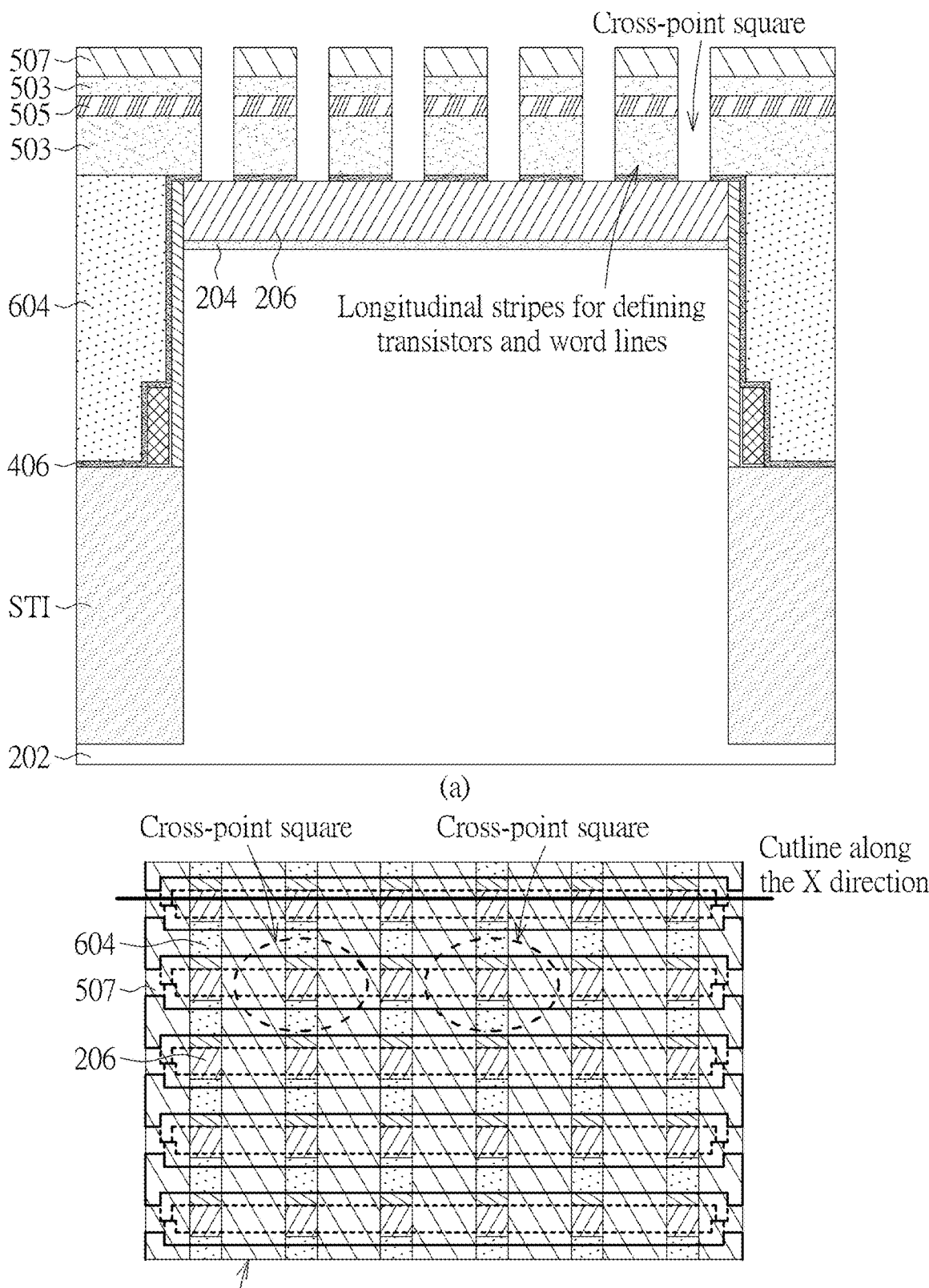
FIG. 5, FIG. 6, FIG. 7, FIG. 8, FIG. 9, FIG. 10, FIG. 11, FIG. 12, FIG. 13 show forming word lines and gates of the access transistors of the DRAM cell array.

In Step 30, as shown in FIG. 5(*a*), back to x-direction, that deposit and etched back a nitride-2 layer 503 and an oxide-2 layer 505 on the top of the pad-nitride layer 206 to achieve following small pitch buried-WL patterning by a patterned photoresist 507. In addition, FIG. 5(*b*) is a top view corresponding to FIG. 5(*a*), and FIG. 5(*a*) is a cross-section view along a cut line of an X direction shown in FIG. 5(*b*).

Figure 6:
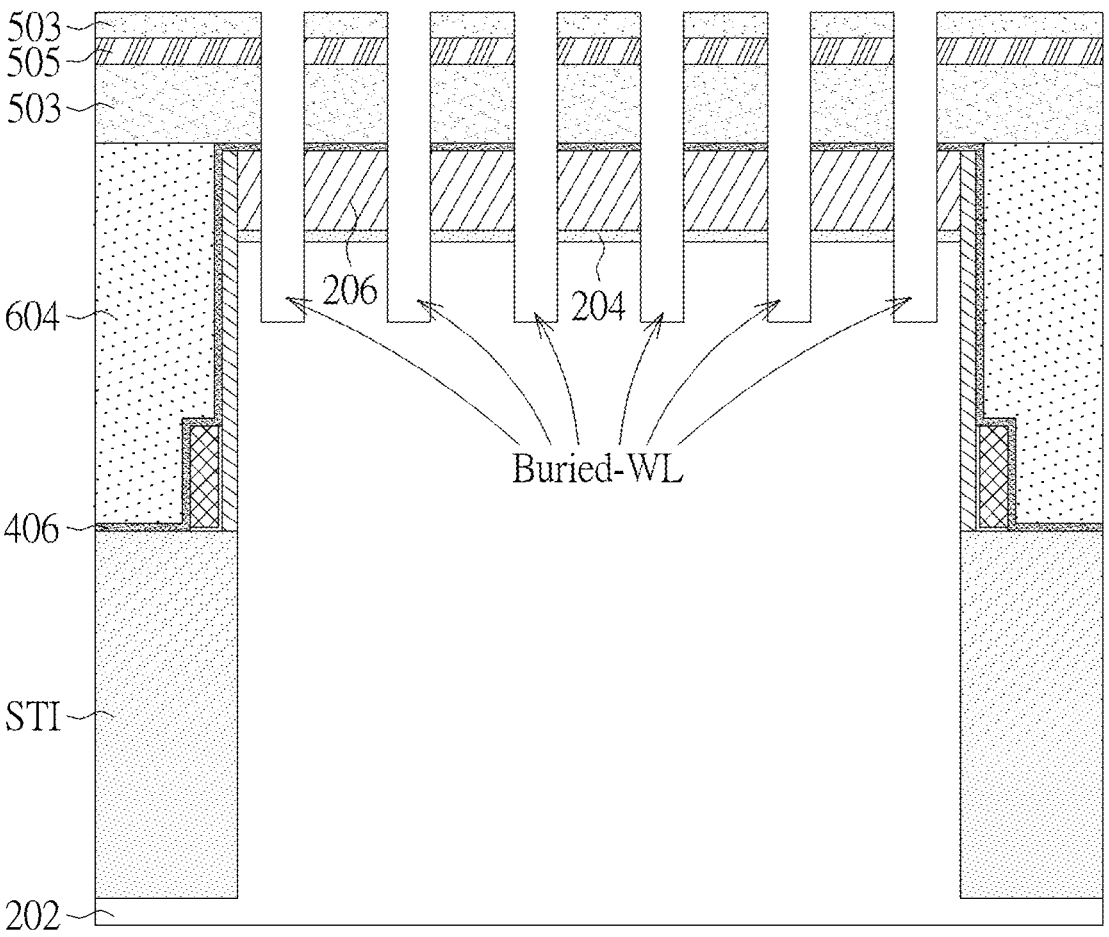

FIG. 6, from x-direction, complete the pad-nitride layer 206/the pad-oxide layer 204 and Si (the substrate 202) etch to form the buried-WL pattern inside the substrate 202.

Figure 7:
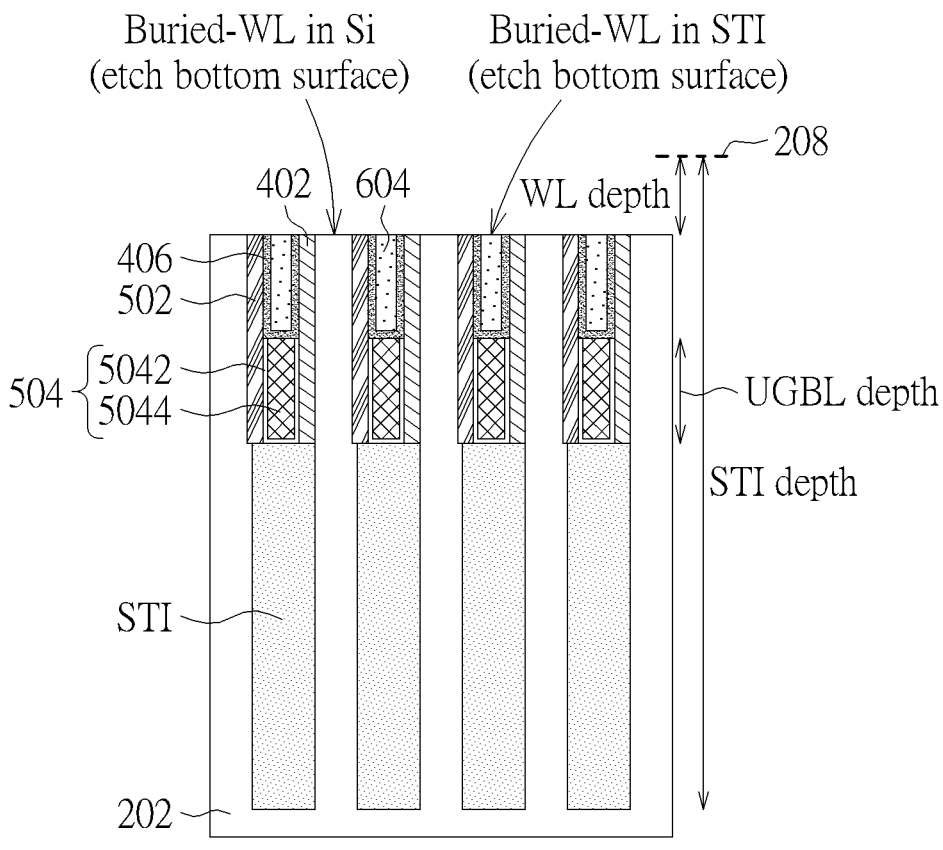
Figure 8:
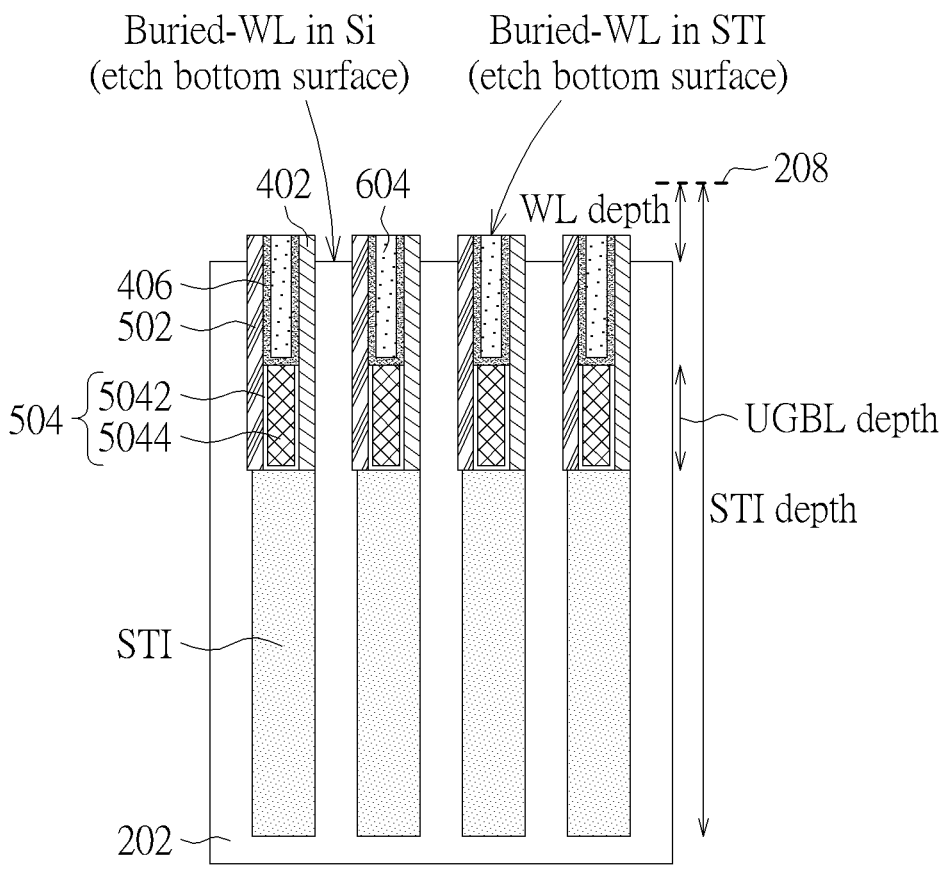
Figure 9:
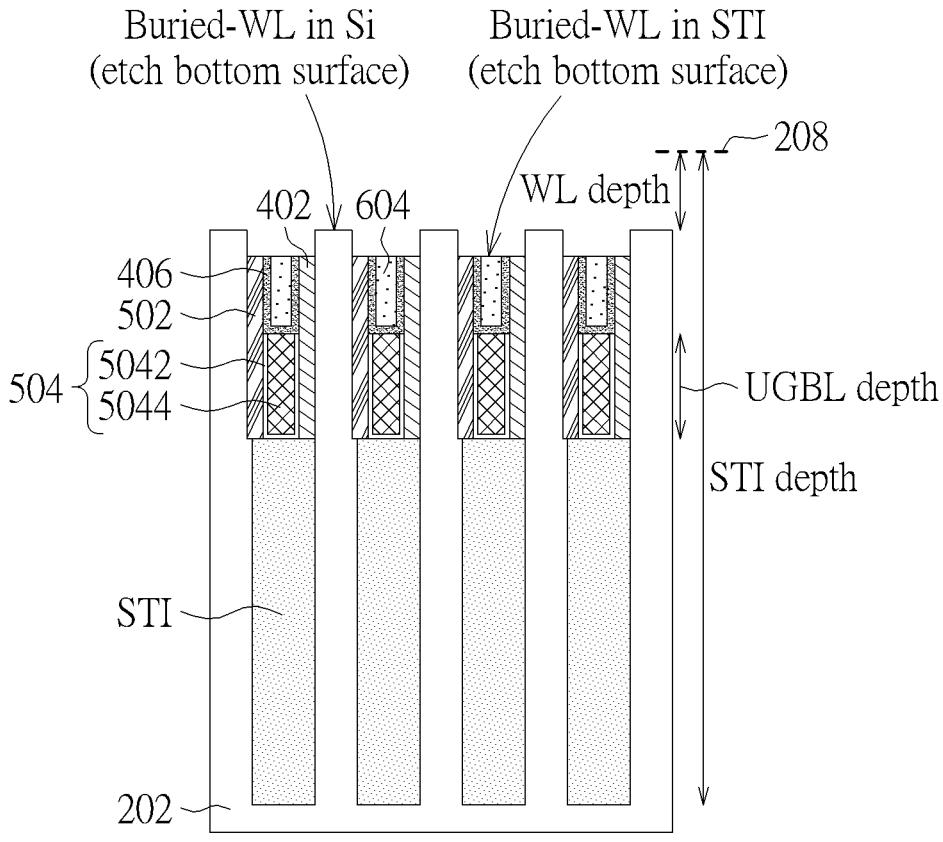

FIG. 7, FIG. 8 and FIG. 9 show the structure from y-direction that cross over AA (active area) and ISO (iso-lation area or STI region). FIG. 7 uses the same etching rate to Si (the substrate 202) for AA (active area) and oxide (the oxide-1 spacer 502 and the HDP Oxide 604)/nitride (the nitride-1 (e.g. SiOCN) spacer 402 and the cap nitride layer 406) for ISO (isolation area or STI region) that can get the same etch depth for both areas (i.e. the AA and the ISO) which have flat surface along a bottom area of the buried-WL.

FIG. 8 use faster etching rate to Si (the substrate 202) for AA (active area) and slower etching rate to oxide (the oxide-1 spacer 502 and the HDP Oxide 604/nitride (the nitride-1 (e.g. SiOCN) spacer 402 and the cap nitride layer 406) for ISO (isolation area or STI region) that can get deeper etching depth in AA (active area) and shallower in ISO (isolation area or STI region). Thus, the bottom of the buried WL in AA (active area) will be lower than the bottom of the buried-WL in in ISO (isolation area or STI region). Therefore, this embodiment introduces different depth of the buried-WL for the both AA and STI regions along the extension direction of the buried-WL The benefit of this etching depth difference is to get larger distance between the UGBL and the WL which can provide lower UGBL to WL coupling capacitance. In this structure, also can combine a same etching rate to Si for AA (active area) and oxide/nitride for ISO (isolation area) process with an additional Si etching process that has high etching selectivity to get less etching to oxide/nitride in ISO (isolation area) and deeper depth in AA (active area).

FIG. 9, opposite to FIG. 8, use slower etching rate to Si for AA (active area) and faster etching rate to oxide/nitride for ISO (isolation area) that can get shallower etching depth in AA (active area) and deeper in STI (isolation area or STI region). Thus, the bottom of the buried WL in AA (active area) will be higher than the bottom of the buried-WL in in ISO (isolation area or STI region). Therefore, this embodi-ment also introduces different depth of the buried-WL for the AA and STI regions along the extension direction of the buried-WL. The benefit of this etching depth difference is to have lower WL resistance due to larger WL depth inside the STI (i.e. the isolation area) to get more metal fill in. In this structure, also can combine a same etching rate to Si for AA (active area) and oxide/nitride for ISO (isolation area)

process with an additional oxide/nitride etching process that has high etching selectivity to get less etching to Si in AA (active area) and deeper depth in STI (isolation area).

Figure 10:
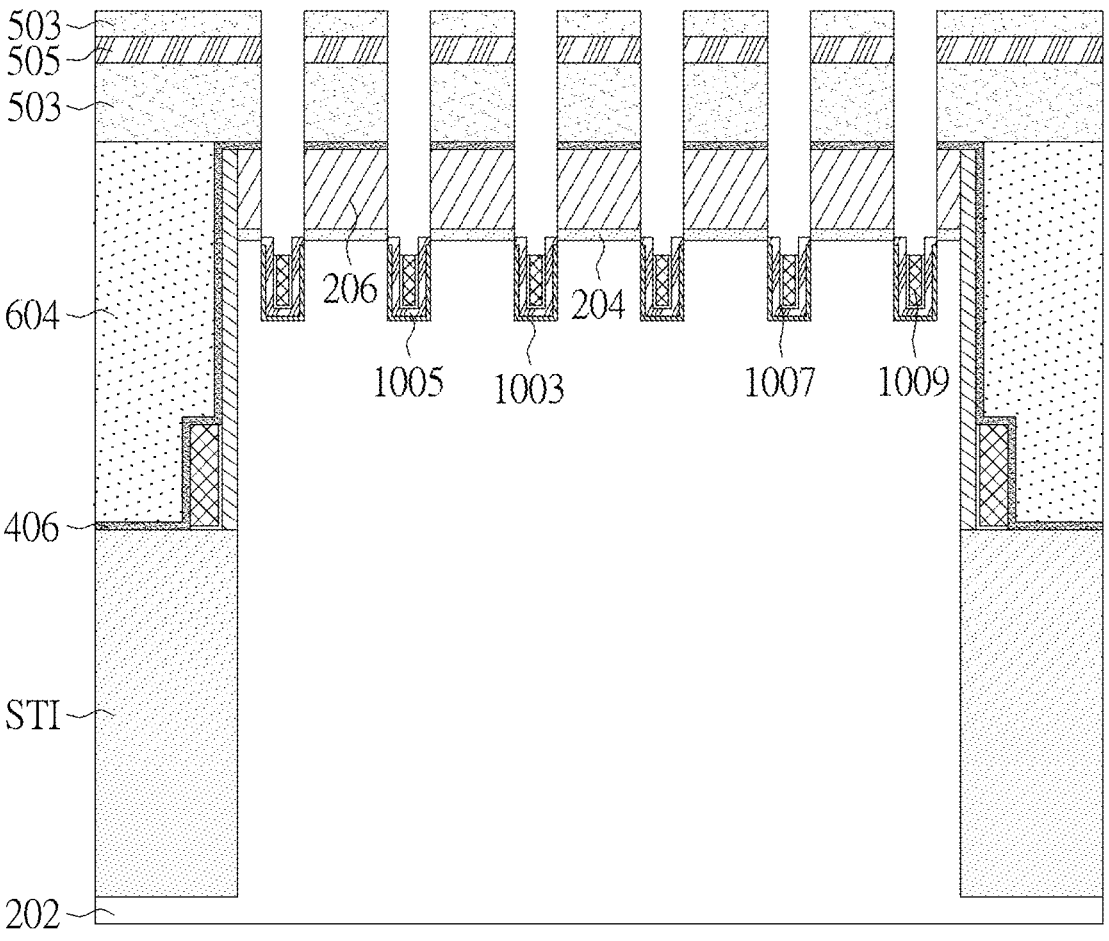

FIG. 10, from x-direction, to deposit p-type selective epitaxy growth (p-SEG) 1003 for the DRAM cell channel formation then do gate dielectric oxidation or High-K depo-sition to form a gate oxide 1005. After that, do control gate material deposition which can deposit thin TiN layer 1007 first then deposit Tungsten (W) 1009. Then, perform Tung-sten (W)/TiN etch back process to complete the buried-WL formation.

Figure 11:
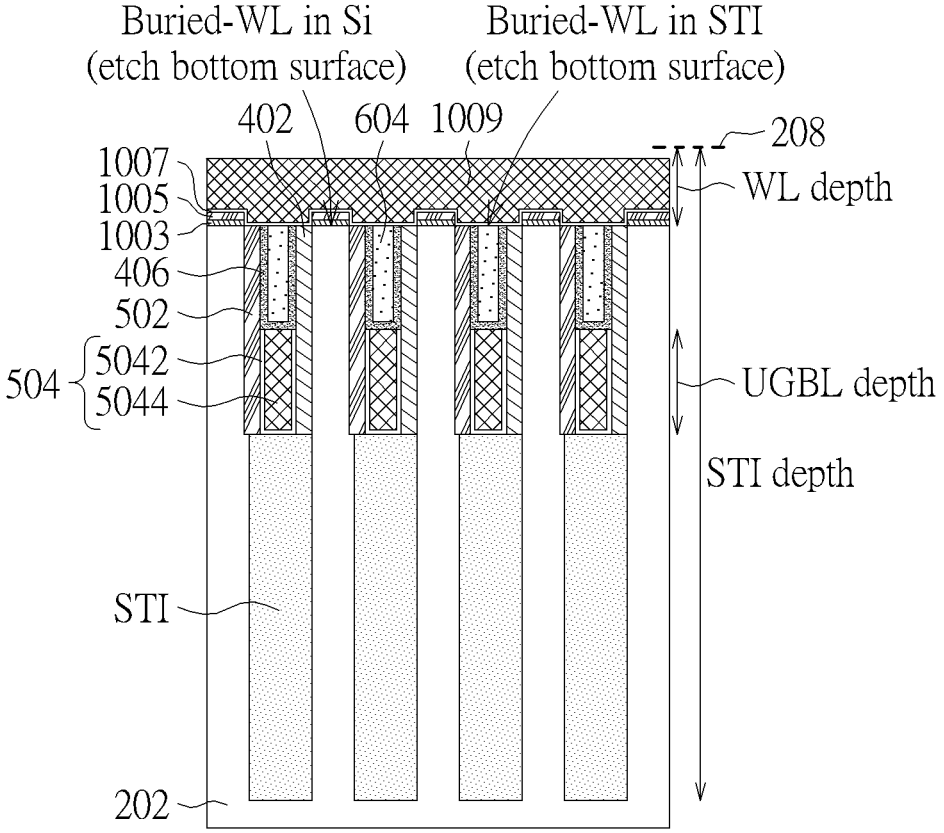
Figure 12:
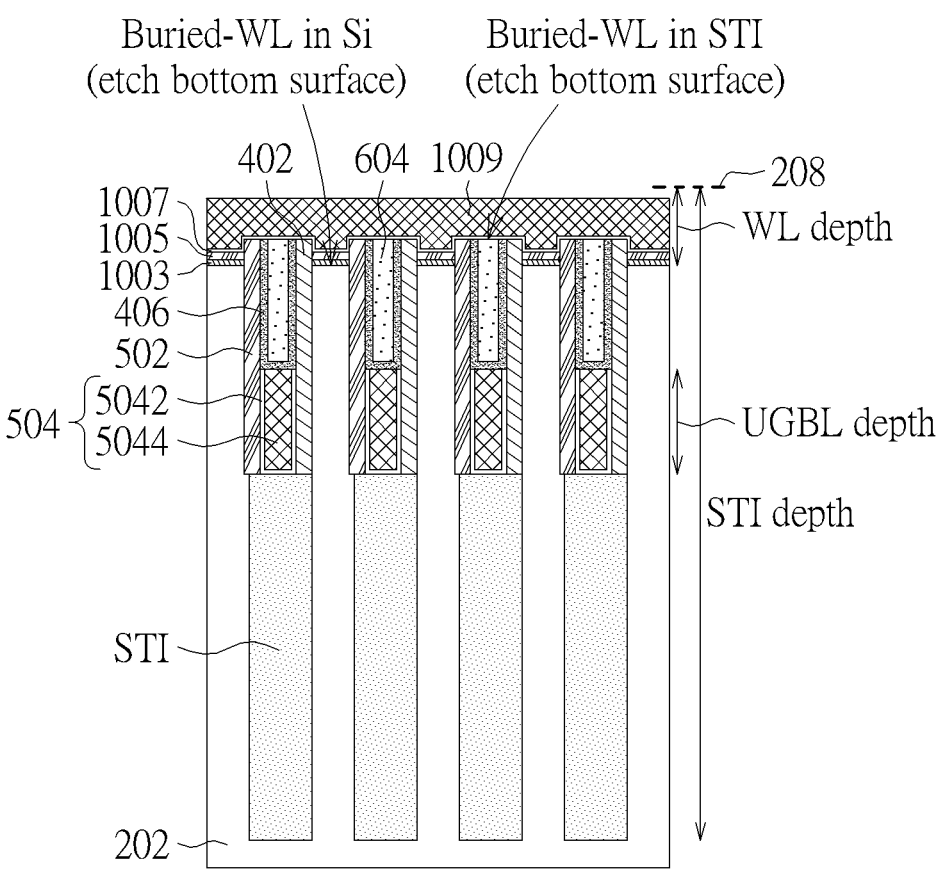
Figure 13:
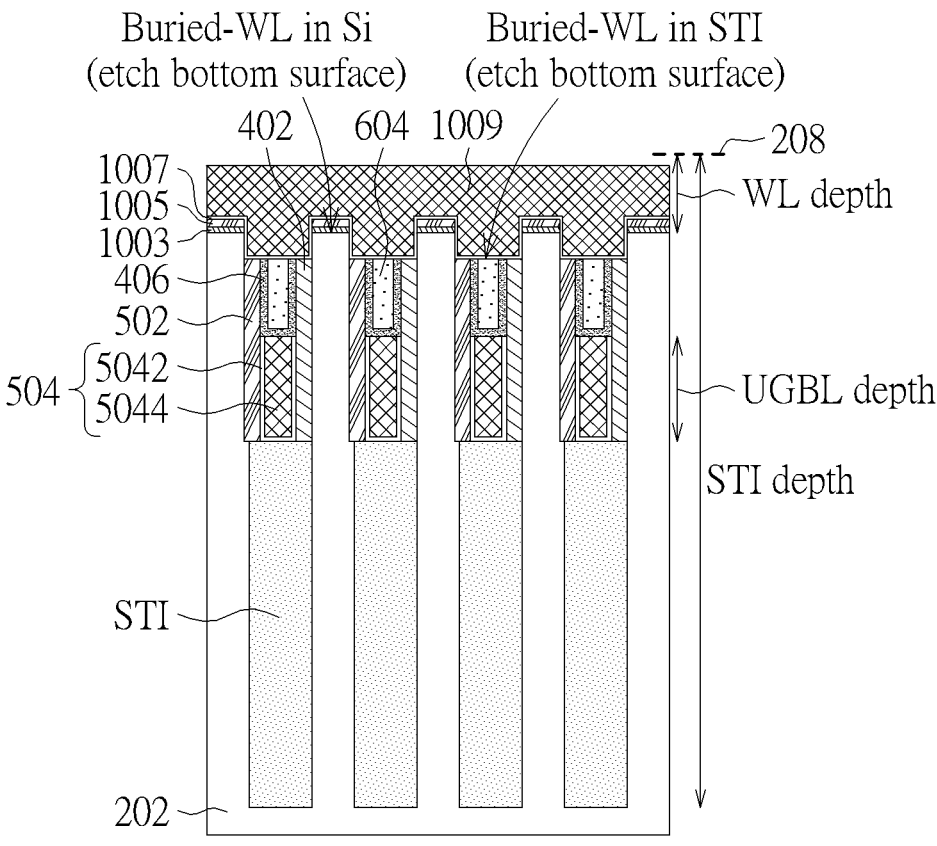

FIG. 11, FIG. 12 and FIG. 13 show the structure from y-direction that cross over AA (active area) and ISO (iso-lation area or STI region) after the buried-WL Tungsten (W)/TiN deposition and etching back but have different shape in the buried-WL bottom according to previous the buried-WL formation process.

FIG. 11 shows flat shape for AA (active area) and oxide/nitride for ISO (isolation area) due to the same etching rate to Si for AA (active area) and oxide/nitride for ISO (isolation area). Thus, the depth of the buried-WL above the AA (active area) is almost the same as the depth of the buried-WL above the ISO (isolation area or STI region), except that there is (p-SEG) 1003 for the DRAM cell channel and the High-K gate dielectric layer 1005 right under the buried-WL above the AA (active area).

FIG. 12 has flat surface on the top of the buried-WL but zigzag in the bottom of the buried-WL which shows deeper in AA (active area) and shallower in STI (isolation area or STI region) due to different etching rate or additional Si etch process. Thus, the depth of the buried-WL above the AA (active area) is greater than the depth of the buried-WL above the ISO (isolation area or STI region). It is noticed that, the buried-WL above the AA (active area) is corre-sponding to the gate conductive region of the transistor.

FIG. 13 has flat surface on the top of buried-WL but zigzag in the bottom of the buried-WL which shows deeper in ISO (isolation area) and shallower in AA (active area) due to different etching rate or additional oxide/nitride etch process. Thus, the depth of the buried-WL above the AA (active area) is less than the depth of the buried-WL above the ISO (isolation area or STI region). Moreover, in this embodiment, the effective channel width of the transistor is wider due to the saddle fin structure.

The innovation of the buried-WL structure includes flat surface on top but zigzag in the bottom surface when cross over the AA (active area) and ISO (isolation area or STI region) which can give the advantage to adjust by require-ment to get lower WL to BL coupling capacitance or get lower WL resistance that dependent on the buried-WL pattern etching process. Thus, the buried-WL has variable depth along the extension direction of the buried-WL.

Based on the "DRAM cell Structure with a H-capacitor over the access transistor (HCoT Cell)", another embodi-ment of the present invention can adjust the etching process regarding the formation of the buried word line to get different width between AA (active area) and ISO (isolation area or STI region) for achieving lower WL resistance. That is, the buried-WL has variable width along the extension direction of the buried-WL. Below are the details to describe the structure and process examples.

Please refer to FIG. 1 again. As shown in FIG. 1, FIG. 1 shows the UGBL (Underground bit Line) DRAM cell struc-ture top view and cross section plot in x-direction. Here, the present invention focus on buried-WL as marked by "WL1", "WL2", "WL3" and the others the same in FIG. 1(*b*).

The buried-WL patterning is following the same process flow as previous mentioned, go through FIG. 3 and FIG. 4 to complete the UGBL formation then do buried-WL Si etch by following the same process as FIG. 5 and FIG. 6.

Figure 14:
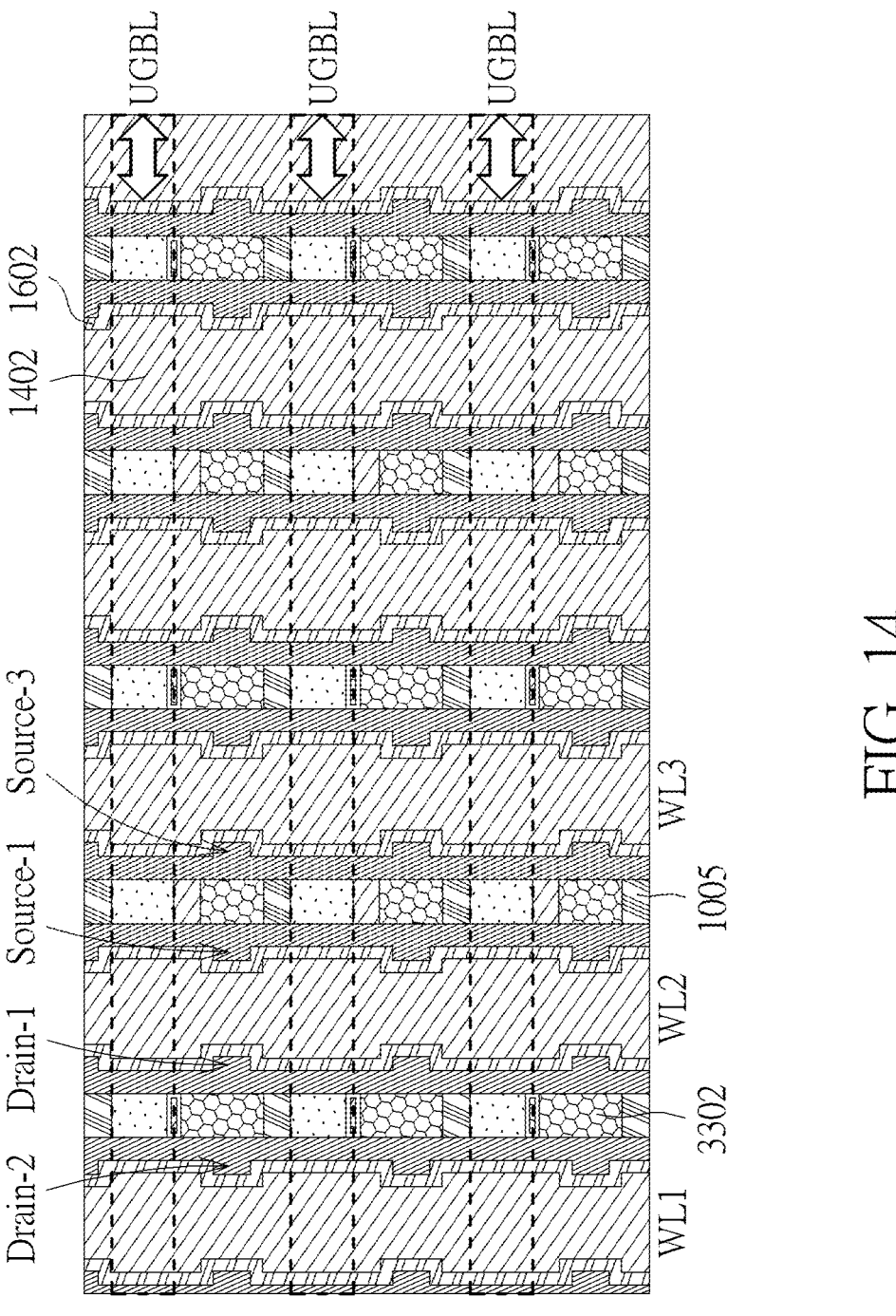
FIG. 14 shows the new invention Lumpy WL from cell top view.

FIG. 1(*b*) and FIG. 14 describe the WL shape difference for original straight WL and new invention Lumpy WL from cell top view, respectively. FIG. 1(*b*) shows cell top view after FIG. 4 buried-WL Si etching process that has straight WL pattern cross over AA (active area) and ISO (isolation area or STI region). FIG. 14 shows cell top view after FIG. 4 buried-WL Si etching process with additional oxide lateral etch to get larger width in ISO (isolation area or STI region) that become Lumpy WL pattern for reducing WL connection resistance to get better DRAM cell performance. Of course, rather than additional oxide lateral etch to get larger width in ISO (isolation area or STI region), it is possible to use additional Si lateral etch to get larger width in AA (active area or active region). Then, the processes in FIG. 10 regarding buried-WL formation could be performed. The innovation of this buried-WL Lumpy structure includes flat on top of WL surface but different width when cross over the AA (active area) and ISO (isolation area) which can give the advantage to get lower WL resistance and adjustable by controlling the oxide lateral etching without limited by photo lithography resolution.

The buried-WL with variable depth or width along the extension direction of the buried-WL could be applied to not only the dynamic random access memory (DRAM) cell structure with underground bit line (UGBL), but also applied to any transistor with the buried-WL.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A memory structure comprising:
   a semiconductor substrate with an original semiconductor surface;
   an active region in the semiconductor substrate and surrounded by a shallow trench isolation (STI) region;
   a transistor formed based on the active region; and
   a buried-WL (word line) extending through the active region and the STI region;
   wherein the buried-WL has variable depth and width along the extension direction of the buried-WL.

2. The memory structure of claim 1, wherein a depth of the buried-WL above the active region is different from a depth of the buried-WL above the STI region.

3. The memory structure of claim 2, wherein the depth of the buried-WL above the active region is less than the depth of the buried-WL above the STI region.

4. The memory structure of claim 2, wherein the depth of the buried-WL above the active region is greater than the depth of the buried-WL above the STI region.

5. The memory structure of claim 1, wherein a width of the buried-WL above the active region is different from a width of the buried-WL above the STI region.

6. The memory structure of claim 5, wherein the width of the buried-WL above the active region is less than the width of the buried-WL above the STI region.

7. The memory structure of claim 5, wherein the width of the buried-WL above the active region is greater than the width of the buried-WL above the STI region.

8. The memory structure of claim 1, wherein the transistor comprising a gate structure, a first conductive region, and a second conductive region, and the memory structure further comprising:
   a capacitor with a signal electrode and a counter electrode, the capacitor being over the transistor, and the signal electrode electrically being coupled to the second conductive region of the transistor and isolated from the first conductive region of the transistor.

9. The memory structure of claim 8, wherein the signal electrode has an H-shape structure covering a top surface and two sidewalls of the gate structure.

10. The memory structure of claim 8, further comprising:
   a bit line disposed under the original semiconductor surface; and
   a connecting plug electrically connecting the bit line to the first conductive region of the transistor.

11. The memory structure of claim 10, wherein the bit line is disposed within the STI region, and the STI region comprises a set of asymmetric material spacers.

12. The memory structure of claim 8, wherein the signal electrode comprises two upward extending pillars and a plurality of lateral beams connected the two upward extending pillars.

13. The memory structure of claim 1, wherein the transistor comprising a gate structure, a first conductive region, and a second conductive region, wherein the gate structure comprises a gate conductive region and a cap dielectric region above the gate conductive region, and a top surface of the gate conductive region is lower than the original semiconductor surface.

14. A memory structure comprising:
   a semiconductor substrate with an original semiconductor surface;
   an active region in the semiconductor substrate and surrounded by a shallow trench isolation (STI) region;
   a transistor formed based on the active region, the transistor comprising a gate structure which comprises a gate conductive region and a cap dielectric region; and
   a buried-WL (word line) connected to the gate structure of the transistor;
   wherein a width of the gate conductive region is different from a width of the buried-WL in the STI region, and a depth of the gate conductive region is different from a depth of the buried-WL in the STI region.

15. The memory structure of claim 14, wherein the depth of the gate conductive region is less than the depth of the buried-WL above the STI region.

16. The memory structure of claim 14, wherein the depth of the gate conductive region is greater than the depth of the buried-WL above the STI region.

17. The memory structure of claim 14, wherein the width of the gate conductive region is less than the width of the buried-WL above the STI region.

18. The memory structure of claim 14, wherein the width of the gate conductive region is greater than the width of the buried-WL above the STI region.

* * * * *